(12) United States Patent
Mei

(10) Patent No.: US 12,178,084 B2
(45) Date of Patent: Dec. 24, 2024

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventor: Wenhai Mei, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 359 days.

(21) Appl. No.: 17/628,145

(22) PCT Filed: Mar. 2, 2021

(86) PCT No.: PCT/CN2021/078745
§ 371 (c)(1),
(2) Date: Jan. 18, 2022

(87) PCT Pub. No.: WO2021/218361
PCT Pub. Date: Nov. 4, 2021

(65) Prior Publication Data
US 2023/0039681 A1 Feb. 9, 2023

(30) Foreign Application Priority Data
Apr. 29, 2020 (CN) .......................... 202010354624.9

(51) Int. Cl.
*H10K 59/122* (2023.01)
*H10K 71/00* (2023.01)
(Continued)

(52) U.S. Cl.
CPC .......... *H10K 59/122* (2023.02); *H10K 71/00* (2023.02); *H10K 71/135* (2023.02); *H10K 59/1201* (2023.02)

(58) Field of Classification Search
None
See application file for complete search history.

(56) References Cited

U.S. PATENT DOCUMENTS

| 2010/0062147 A1 | 3/2010 | Kinoshita |
| 2019/0115402 A1 | 4/2019 | Wang et al. |

(Continued)

FOREIGN PATENT DOCUMENTS

| CN | 107623082 A | 1/2018 |
| CN | 107689390 A | 2/2018 |

(Continued)

OTHER PUBLICATIONS

CN202010354624.9 first office action.

*Primary Examiner* — Michelle Mandala
(74) *Attorney, Agent, or Firm* — IPro, PLLC

(57) ABSTRACT

Provided are a display substrate, a preparation method thereof, and a display apparatus. A portion of a pixel definition layer that is in contact with a light-emitting functional layer is configured to have the performance of switching between hydrophilicity and hydrophobicity when an external condition changes. When film layers of the light-emitting functional layer are formed, due to the inconsistent hydrophilicity or hydrophobicity of the film layers of the light-emitting functional layer, when a hydrophilic light-emitting functional layer is formed, the pixel definition layer switches, under processing via the external condition, the portion of the pixel definition layer that is in contact with the light-emitting functional layer to be hydrophobic, and when a hydrophobic light-emitting functional layer is formed, the pixel definition layer switches, under processing via the external condition, the portion of the pixel definition layer that is in contact with the light-emitting functional layer to be hydrophilic.

11 Claims, 11 Drawing Sheets

(51) Int. Cl.
    *H10K 71/13*     (2023.01)
    *H10K 59/12*     (2023.01)

(56) References Cited

U.S. PATENT DOCUMENTS

| | | |
|---|---|---|
| 2019/0207155 A1* | 7/2019 | Lee ................ H10K 50/844 |
| 2020/0035765 A1 | 1/2020 | Li et al. |
| 2020/0064734 A1* | 2/2020 | Li ........................ C08K 5/08 |
| 2020/0075694 A1 | 3/2020 | Dai |
| 2022/0052131 A1 | 2/2022 | Li et al. |

FOREIGN PATENT DOCUMENTS

| | | |
|---|---|---|
| CN | 108919605 A | 11/2018 |
| CN | 109192875 A | 1/2019 |
| CN | 110622317 A | 12/2019 |
| CN | 111599849 A | 8/2020 |

\* cited by examiner

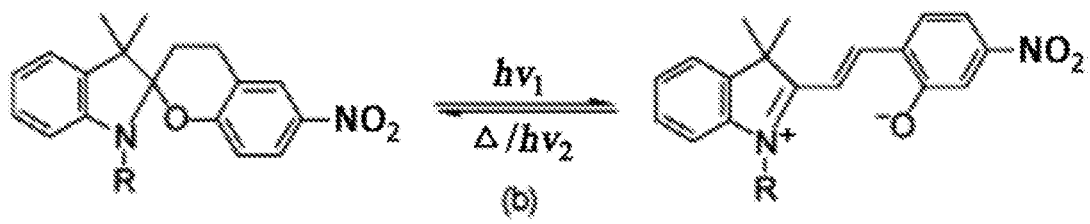
Fig. 7B
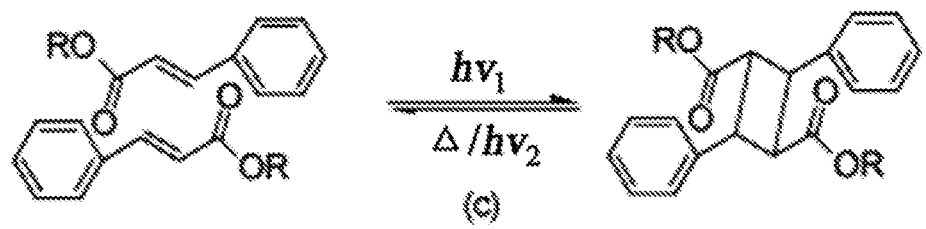
Fig. 7C
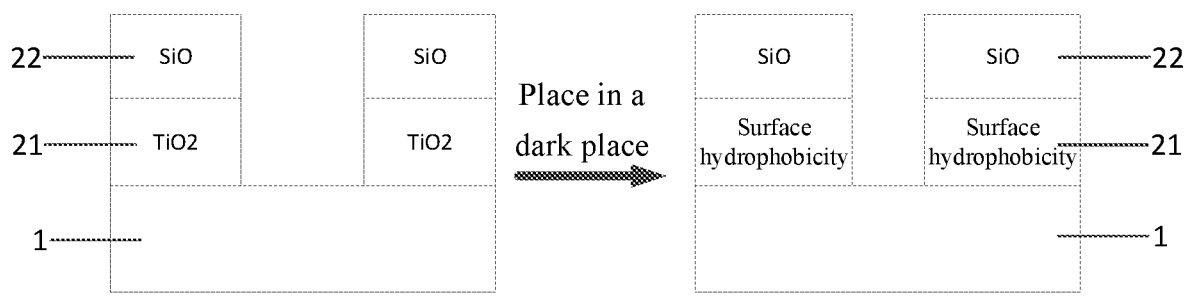
Fig. 8
Fig. 9

DISPLAY SUBSTRATE AND PREPARATION METHOD THEREFOR, AND DISPLAY APPARATUS

CROSS-REFERENCE TO RELATED APPLICATIONS

The present disclosure is a US National Stage of International Application No. PCT/CN2021/078745, filed on Mar. 2, 2021, which claims the priority of the Chinese patent application No. 202010354624.9 filed to the China Patent Office on Apr. 29, 2020, and entitled "Array Substrate and Preparation Method Therefor, and Display Apparatus", of which the entire contents are incorporated herein by reference.

FIELD

The present disclosure relates to the technical field of display, in particular to a display substrate and a preparation method therefor, and a display apparatus.

BACKGROUND

An organic light emitting diode (OLED) display has the advantages of being low in energy consumption, self-luminous, wide in viewing angle, high in response speed and the like, is one of hotspots in the research field of displays nowadays, and is considered to be a next-generation display technology.

SUMMARY

Embodiments of the present disclosure provide a display substrate, including:
  a base substrate;
  a pixel defining layer, located on one side of the base substrate, where the pixel defining layer has a plurality of opening areas; and
  a light-emitting functional layer, located in the plurality of opening areas;
  where a part, being in contact with the light-emitting functional layer, in the pixel defining layer has a property of being converted between hydrophilicity and hydrophobicity under change of an external condition.

Optionally, in the above display substrate provided by the embodiments of the present disclosure, the pixel defining layer includes:
  a first pixel defining layer, where the first pixel defining layer includes a plurality of pixel defining structures surrounding the plurality of opening areas and being mutually independent, where the plurality of pixel defining structures are in contact with the light-emitting functional layer; and
  a second pixel defining layer, where the second pixel defining layer is located on one side, far away from the base substrate, of the first pixel defining layer, and covers the plurality of pixel defining structures, where a structure of the second pixel defining layer is a latticed structure exposing the plurality of opening areas, and the second pixel defining layer is configured to enable adjacent pixel defining structures to be insulated from each other.

Optionally, in the above display substrate provided by the embodiments of the present disclosure, a thickness of each of the pixel defining structures is greater than a thickness of the light-emitting functional layer along a direction pointing from the base substrate to the pixel defining layer.

Optionally, in the above display substrate provided by the embodiments of the present disclosure, the first pixel defining layer is converted from hydrophilicity to hydrophobicity, or converted from hydrophobicity to hydrophilicity under ultraviolet light irradiation.

Optionally, in the above display substrate provided by the embodiments of the present disclosure, a material of the first pixel defining layer is azobenzene, spiropyrane, cinnamic acid, titanium dioxide or vanadium pentoxide; and a material of the second pixel defining layer is an insulating material.

Optionally, in the above display substrate provided by the embodiments of the present disclosure, a thickness of the first pixel defining layer is 100 nm to 200 nm, and a thickness of the second pixel defining layer is 50 nm to 150 nm.

Optionally, in the above display substrate provided by the embodiments of the present disclosure, the light-emitting functional layer includes a hole injection layer, a hole transport layer, a light-emitting layer and an electron transport layer arranged in a stacked manner.

Optionally, during specific implementation, in the above display substrate provided by the embodiments of the present disclosure, the hole injection layer and the electron transport layer are hydrophilic, and the hole transport layer and the light-emitting layer are hydrophobic.

Optionally, during specific implementation, in the above display substrate provided by the embodiments of the present disclosure, a material of the light-emitting layer is a quantum dot material.

Correspondingly, embodiments of the present disclosure further provide a display apparatus, including the above display substrate provided by the embodiments of the present disclosure.

Correspondingly, embodiments of the present disclosure further provide a preparation method of a display substrate, including:
  forming a pixel defining layer with a plurality of opening areas on a base substrate;
  forming a light-emitting functional layer in each opening area, where a part, being in contact with the light-emitting functional layer, in the pixel defining layer has a property of being converted between hydrophilicity and hydrophobicity under change of an external condition; and
  before each film layer in the light-emitting functional layer is formed in the opening areas, adjusting a hydrophilic or hydrophobic property of the part, being in contact with the light-emitting functional layer to be formed, in the pixel defining layer to be opposite to a hydrophilic or hydrophobic property of the light-emitting functional layer to be formed.

Optionally, during specific implementation, in the above preparation method provided by the embodiments of the present disclosure, the forming the pixel defining layer with the plurality of opening areas on the base substrate, specifically includes:
  forming first photoresist on the base substrate, and exposing and developing the first photoresist to form a patterned first photoresist layer;
  forming a first pixel defining material layer on the base substrate with the first photoresist layer formed;
  stripping the first photoresist layer to remove the first photoresist layer and the first pixel defining material layer above the first photoresist layer, to form a plurality of pixel defining structures surrounding the plurality of opening areas and being mutually independent, where the plurality of pixel defining structures constitute a first pixel defining layer;

forming an insulating material film layer on one side, far away from the base substrate, of the first pixel defining layer; and patterning the insulating material film layer to expose the plurality of opening areas to form a second pixel defining layer, where the second pixel defining layer covers the plurality of pixel defining structures, a structure of the second pixel defining layer is a latticed structure exposing the plurality of opening areas, and the second pixel defining layer is configured to enable adjacent pixel defining structures to be insulated from each other.

Optionally, during specific implementation, in the above preparation method provided by the embodiments of the present disclosure, the forming the light-emitting functional layer in each opening area, specifically includes:

treating, under a first external condition, the base substrate with the second pixel defining layer formed, so that the first pixel defining layer is hydrophobic;

forming a hydrophilic hole injection layer in each opening area by adopting an ink-jet printing process;

treating, under a second external condition, the base substrate with the hole injection layer formed, so that the first pixel defining layer is hydrophilic;

forming a hydrophobic hole transport layer on one side, far away from the base substrate, of the hole injection layer by adopting the ink-jet printing process;

forming a hydrophobic light-emitting layer on one side, far away from the base substrate, of the hole transport layer by adopting the ink-jet printing process;

treating, under the first external condition, the base substrate with the light-emitting layer formed, so that the first pixel defining layer is hydrophobic; and forming a hydrophilic electron transport layer on one side, far away from the base substrate, of the light-emitting layer by adopting the ink-jet printing process.

BRIEF DESCRIPTION OF THE DRAWINGS

FIG. 7B is another schematic diagram of hydrophobicity conversion of a first pixel defining layer material in a display substrate provided by an embodiment of the present disclosure.

FIG. 7C is another schematic diagram of hydrophobicity conversion of a first pixel defining layer material in a display substrate provided by an embodiment of the present disclosure.

FIG. 8 is a schematic structural diagram of a display substrate under ultraviolet light irradiation provided by an embodiment of the present disclosure.

FIG. 9 is another schematic structural diagram of a display substrate when placed in a dark place provided by an embodiment of the present disclosure.

DETAILED DESCRIPTION OF THE EMBODIMENTS

Figure 1:
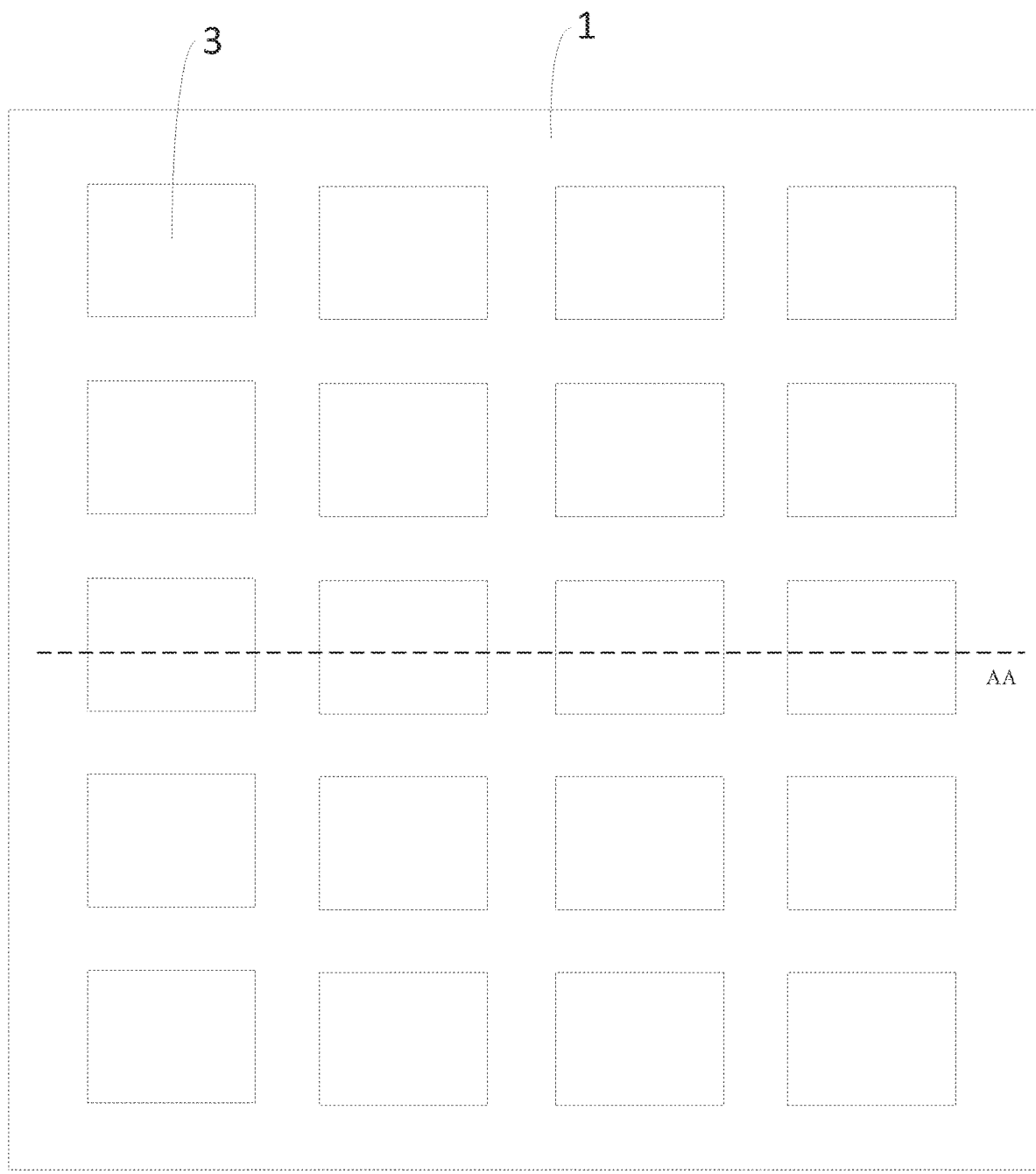
FIG. 1 is a schematic top view of a display substrate provided by an embodiment of the present disclosure.

At present, a film forming mode of a light-emitting layer in an OLED display mainly includes an evaporation mode and an ink-jet printing mode. Film forming in the evaporation mode is relatively mature in application of preparing small-size OLED displays, and film forming in the ink-jet printing mode is considered to be an important mode for realizing mass production of large-size OLED displays due to its high film forming rate, relatively high material utilization rate, and being capable of realizing large size. Generally, when film layers of a light-emitting functional layer is manufactured, a pixel defining layer needs to be manufactured on a substrate to limit an area where each pixel is located, and then the light-emitting functional layer is manufactured in specific opening areas of the corresponding pixels by adopting an ink-jet printing process.

However, when a plurality of film layers of the light-emitting functional layer are printed, due to a Marangoni effect (a phenomenon of mass shifting due to the gradient of tension between two liquid interfaces with different surface tensions), a thin film with a non-uniform thickness (thick on two sides and thin in the middle) is prone to being formed, so that a thin film layer is prone to being formed in the middle of the opening area, and the thin film layer may be broken down due to a high voltage in a final device. Meanwhile, the light-emitting efficiency and the service life of the device are prone to being reduced due to the non-uniformity of the film layer in the opening area, so that how to form the light-emitting functional layer with a uniform film thickness in the opening area is an important step in an OLED process.

In order to make the objective, technical solutions and advantages of the present disclosure more clear, the present disclosure will be further described below in detail with reference to the drawings. Obviously, the described embodiments are only part of the embodiments of the present disclosure, but not all the embodiments. Based on the embodiments in the present disclosure, all other embodiments obtained by a person of ordinary skill in the art without inventive efforts fall within the protection scope of the present disclosure.

The shapes and sizes of all components in the drawings do not reflect the true scale, and only intend to illustrate the content of the present disclosure.

Specific implementations of a display substrate, a preparation method thereof and a display apparatus provided by embodiments of the present disclosure are illustrated below in detail with reference to the drawings.

Figure 2A:
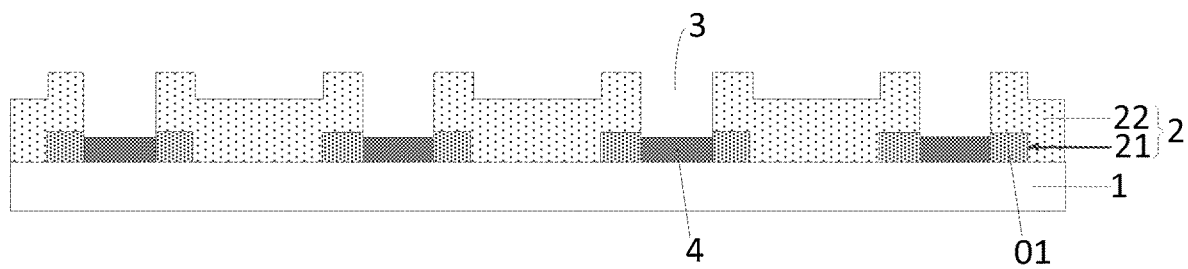
FIG. 2A is a schematic structural diagram of a display substrate provided by an embodiment of the present disclosure.

The embodiments of the present disclosure provide a display substrate, as shown in FIG. 1 and FIG. 2A. FIG. 1 is a schematic structural top view of the display substrate, and FIG. 2A is a schematic section diagram along an AA direction in FIG. 1. The display substrate includes a base substrate 1, and a pixel defining layer 2 located on one side of the base substrate 1. The pixel defining layer 2 has a plurality of opening areas 3; the opening areas 3 internally include a light-emitting functional layer 4; and a part (a first pixel defining layer 21, introduced in detail later), being in contact with the light-emitting functional layer 4, in the pixel defining layer 2 has a property of being converted between hydrophilicity and hydrophobicity under change of an external condition.

According to the above display substrate provided by the embodiments of the present disclosure, the part, being in contact with the light-emitting functional layer 4, in the pixel defining layer 2 is set to have the property of being converted between the hydrophilicity and the hydrophobicity under change of the external condition. In this way, when film layers of the light-emitting functional layer 4 are formed, the hydrophilicity or hydrophobicity of film layers of the light-emitting functional layer 4 are not consistent. For example, when a hydrophilic light-emitting functional layer 4 is formed, the part, being in contact with the light-emitting functional layer 4, of the pixel defining layer 2 is converted to be hydrophobic under treatment of the external condition; and when a hydrophobic light-emitting functional layer 4 is formed, the part, being in contact with the light-emitting functional layer 4, of the pixel defining layer 2 is converted to be hydrophilic under treatment of the external condition. Therefore, the light-emitting functional layer 4 formed in the opening areas 3 does not climb to an inner wall of the pixel defining layer 2, it is ensured that a film thickness of the light-emitting functional layer 4 formed in the opening areas 3 is uniform, a display effect of a display panel is improved, and a service life of a light-emitting device is prolonged.

It should be noted that the base substrate of the display substrate provided by the embodiments of the present disclosure is a base substrate including a plurality of anodes (or cathodes) which are in one-to-one correspondence with the opening areas. Generally, a conductive film layer is firstly deposited on the base substrate, the conductive film layer is patterned to form the plurality of anodes (or cathodes), then a pixel defining film layer is spin-coated on the base substrate with the plurality of anodes (or cathodes) formed, then the pixel defining film layer is patterned to form the pixel defining layer exposing the plurality of anodes (or cathodes), and the exposed anode (or cathode) areas are the opening areas. Then the light-emitting functional layer, the cathodes (or anodes) and a subsequent film layer are prepared. Specifically; an anode (or cathode) material includes a transparent conductive material or a semitransparent conductive material or a metallic conductive material. The detailed content for manufacturing the pixel defining layer of the present disclosure is introduced subsequently.

During specific implementation, in the above display substrate provided by the embodiments of the present disclosure, because an organic electroluminescent device has two types of bottom emission and top emission, a device structure of bottom emission is formed by arranging a transparent anode (or cathode) and a reflective cathode (or anode) structure: on the contrary: a device structure of top emission is formed through a structure of a transparent cathode (or anode) and a reflective anode (or cathode). Therefore, according to the different device structures, selection of anode (or cathode) materials is also different, and the materials are usually high-work-function transparent or semitransparent materials such as ITO, Ag, NiO, Al and graphene.

Figure 3:
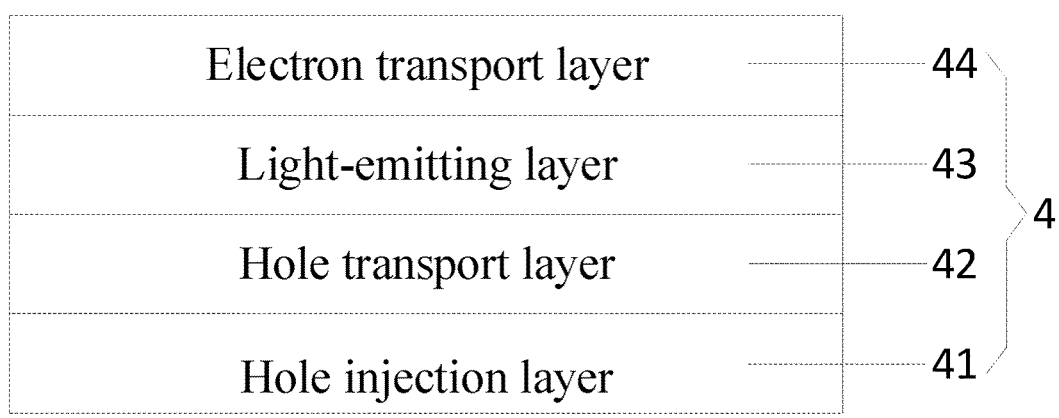
FIG. 3 is a schematic structural diagram of a light-emitting functional layer provided by an embodiment of the present disclosure.

During specific implementation, in the above display substrate provided by the embodiment of the present disclosure, as shown in FIG. 3, the light-emitting functional layer 4 includes a hole injection layer 41, a hole transport layer 42, a light-emitting layer 43 and an electron transport layer 44 arranged in a stacked manner. When a display apparatus including the display substrate provided by the embodiments of the present disclosure is an upright structure, the hole injection layer 41 is firstly formed on the base substrate 1, and then the hole transport layer 42, the light-emitting layer 43 and the electron transport layer 44 are sequentially formed; and when the display apparatus including the display substrate provided by the embodiments of the present disclosure is an inverted structure, the electron transport layer 44 is firstly formed on the base substrate 1, and then the light-emitting layer 43, the hole transport layer 42 and the hole injection layer 41 are sequentially formed. Certainly, during specific implementation, the light-emitting functional layer 4 further includes an electron injection layer. The embodiments of the present disclosure are illustrated by taking an example that the light-emitting functional layer 4 include the hole injection layer 41, the hole transport layer 42, the light-emitting layer 43 and the electron transport layer 44 which are the upright structure.

Specifically, in the above display substrate provided by the embodiments of the present disclosure, the light-emitting layer at least includes: a red light-emitting layer, a green light-emitting layer and a blue light-emitting layer. In addition, the light-emitting layer may further include a white light-emitting layer, which is determined according to the specific array mode of pixels and is not specifically limited here.

During specific implementation, in order to improve the light-emitting efficiency of a device, in the above display substrate provided by the embodiments of the present disclosure, a material of the light-emitting layer is a quantum dot material. The quantum dot material may be a binary, ternary or multi-element quantum dot light-emitting material, which is not listed one by one here.

During specific implementation, in the display substrate provided by the embodiments of the present disclosure, as shown in FIG. 3, the hole injection layer 41 and the electron transport layer 44 are generally hydrophilic, and the hole transport layer 42 and the light-emitting layer 43 are generally hydrophobic. Specifically, the embodiments of the present disclosure adopt an ink-jet printing process to form the hole injection layer 41, the hole transport layer 42, the light-emitting layer 43 and the electron transport layer 44. Ink states (namely liquid states) corresponding to the hole injection layer 41, the hole transport layer 42, the light-emitting layer 43 and the electron transport layer 44 and solid states after the hole injection layer 41, the hole transport layer 42, the light-emitting layer 43 and the electron transport layer 44 are respectively dried are kept unchanged in hydrophilicity or hydrophobicity. For example, the liquid hole injection layer 41 and electron transport layer 44 are hydrophilic, and the solid hole injection layer 41 and electron transport layer 44 are still hydrophilic; and the liquid hole transport layer 42 and light-emitting layer 43 are hydrophobic, and the solid hole transport layer 42 and light-emitting layer 43 are still hydrophobic.

Specifically, because the hydrophilicity or hydrophobicity of the hole injection layer, the hole transport layer, the light-emitting layer and the electron transport layer are inconsistent, when film layers of the light-emitting functional layer are formed by adopting the ink-jet printing process, a thin film with a non-uniform thickness (thick on two sides and thin in the middle) is prone to being formed due to the Marangoni effect, a thin film layer is prone to being formed in the middle of the opening area, and the thin film layer may be broken down due to a high voltage in a final device. Therefore, the present disclosure provides the pixel defining layer which can enable the film thickness of each film layer of the formed light-emitting functional layer to be uniform, improves the light-emitting efficiency of the display device, and prolongs the service life of the display device.

Specifically, the hydrophilicity refers to performance of affinity to water, and the hydrophobicity refers to performance of repulsion to water. The hydrophilicity of the hole injection layer and the electron transport layer means that; contact angles between the hole injection layer and water as well as between the electron transport layer and water are generally smaller than 50 degrees; and the hydrophobicity of the hole transport layer and the light-emitting layer means that; contact angles between the hole transport layer and water as well as between the light-emitting layer and water are generally greater than 120 degrees.

A case that the pixel defining layer provided by the embodiments of the present disclosure enables the film thickness of each film layer of the formed light-emitting functional layer be uniform is introduced below in detail.

Figure 2B:
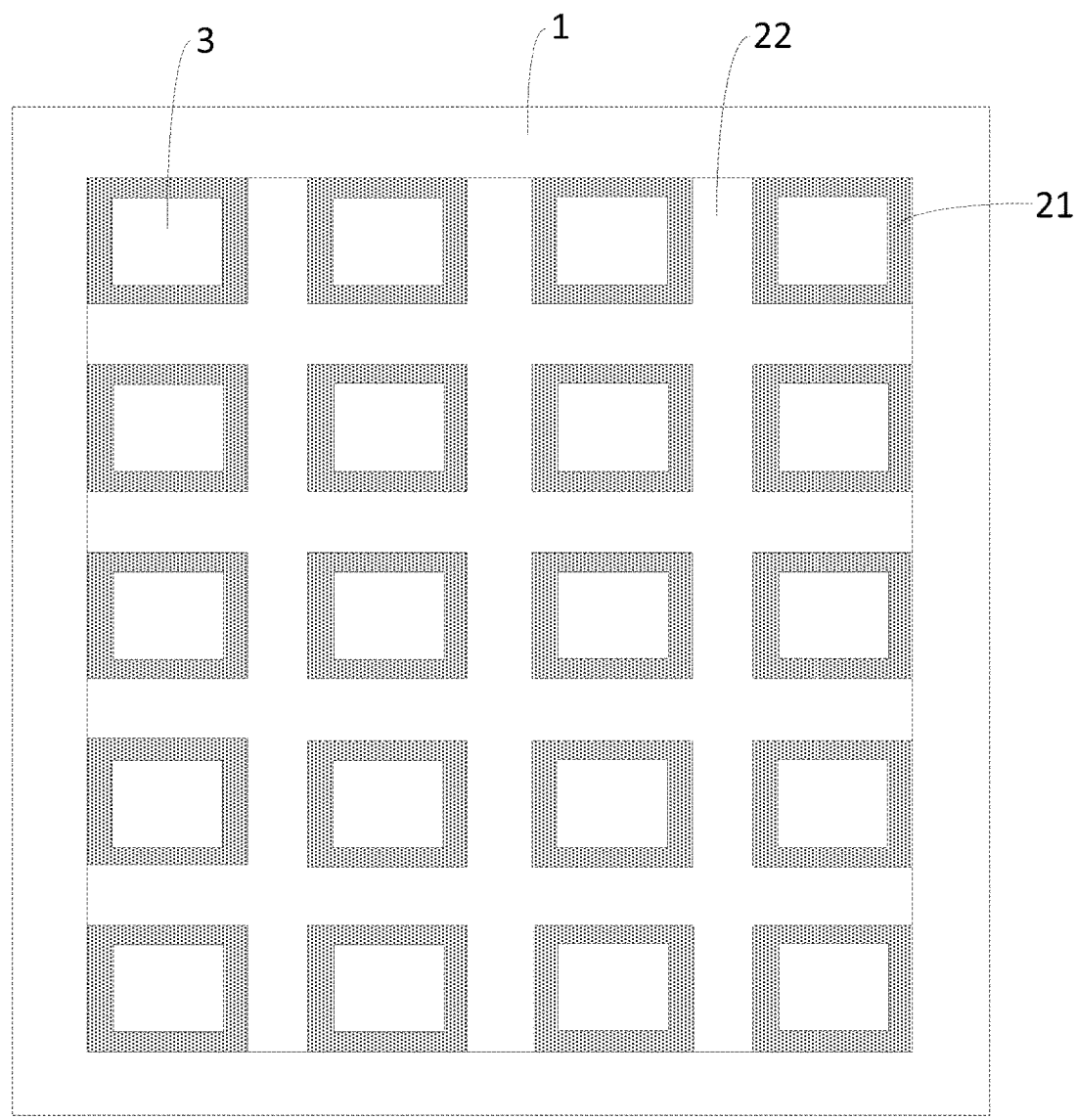
FIG. 2B is a schematic structural top view of a pixel defining layer provided by an embodiment of the present disclosure.

During specific implementation, in the above display substrate provided by the embodiments of the present disclosure, as shown in FIG. 2A and FIG. 2B. FIG. 2B is a schematic structural top view of the pixel defining layer; and the pixel defining layer 2 includes a first pixel defining layer 21 and a second pixel defining layer 22 located on one side, far away from the base substrate 1, of the first pixel defining layer 21.

The first pixel defining layer 21 includes a plurality of pixel defining structures 01 which surround the plurality of opening areas 3 and are mutually independent, and the pixel defining structures 01 are in contact with the light-emitting functional layer 4. Specifically, because the first pixel defining layer 21 is a part which is in contact with the light-emitting functional layer 4, the first pixel defining layer 21 has a property of being converted between hydrophilicity and hydrophobicity under change of the external condition. Generally, materials which have the property of being converted between the hydrophilicity and the hydrophobicity are mostly semiconductor materials, that is, a material of the first pixel defining layer 21 is the semiconductor material, and the semiconductor material has certain conductivity. Moreover, because the first pixel defining layer 21 is in contact with both the anode and the cathode, the first pixel defining layer 21 is likely to cause short between the adjacent opening areas 3 (namely sub-pixels), and the phenomenon of electric leakage between the pixels is caused. In order to prevent short between adjacent sub-pixels, the first pixel defining layer 21 is arranged to include the plurality of pixel defining structures 01 which surround all the opening areas 3 and are mutually independent, so that the short problem does not occur between the adjacent opening areas 3.

As shown in FIG. 2B, the second pixel defining layer 22 covers the plurality of pixel defining structures 01, a structure of the second pixel defining layer 22 is a latticed structure exposing the plurality of opening areas 3, and the second pixel defining layer 22 is configured to enable the adjacent pixel defining structures 01 to be insulated from each other. Specifically, because all the pixel defining structures 01 of the first pixel defining layer 21 are mutually independent, it is assumed that when the light-emitting functional layer 4 and the cathode are directly formed after the first pixel defining layer 21 is formed, the cathode is generally a whole-face arrangement structure, namely, the cathode covers the first pixel defining layer 21, and the short problem still occurs between the adjacent opening areas 3. Therefore, according to the embodiments of the present disclosure, the second pixel defining layer 22 is further formed on one side, far away from the base substrate 1, of the first pixel defining layer 21, so that the adjacent pixel defining structures 01 are insulated from each other. Certainly, during specific implementation, the cathode may also be an independently arranged structure, which is not limited in the present disclosure.

Figure 4:
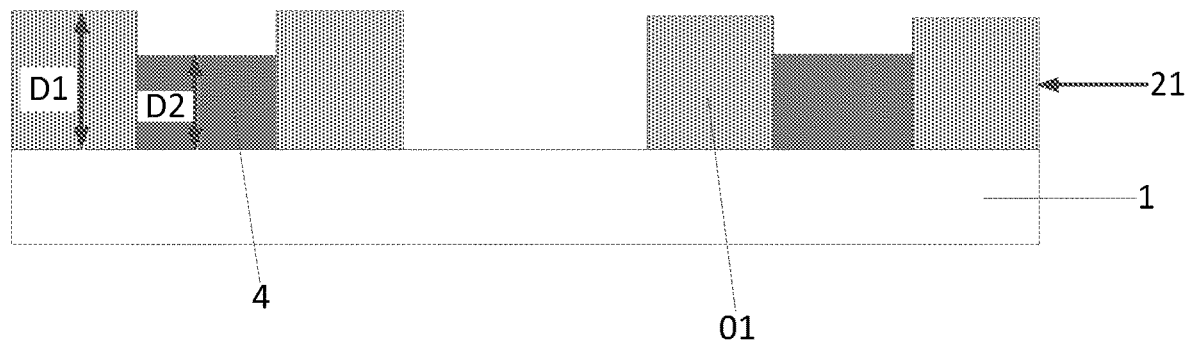
FIG. 4 is another schematic structural diagram of a display substrate provided by an embodiment of the present disclosure.

During specific implementation, in the above display substrate provided by the embodiments of the present disclosure, as shown in FIG. 4, for clear showing. FIG. 4 only shows part of the structure in FIG. 2A. A thickness D1 of each pixel defining structure 01 is greater than a thickness D2 of the light-emitting functional layer 4 along a direction pointing from the base substrate 1 to the pixel defining layer 2, in this way, each film layer of the light-emitting functional layer 4 formed by adopting the ink-jet printing process may be located in the pixel defining structures 01. The hydrophilicity or hydrophobicity of film layers of the light-emitting functional layer 4 are inconsistent, therefore, each film layer forming the light-emitting functional layer 4 may utilize that the first pixel defining layer 21 may be converted between the hydrophilicity and the hydrophobicity under an external condition. For example, when the film layer of the light-emitting functional layer 4 is hydrophilic, the first pixel defining layer 21 is converted to be hydrophobic under the external condition; and when the film layer of the light-emitting functional layer 4 is hydrophobic, the first pixel defining layer 21 is converted to be hydrophilic under the external condition, so that a phenomenon that all the film layers of the light-emitting functional layer 4 climb to an inner wall of the first pixel defining layer 21 does not occur, and it is ensured that the film thickness of each film layer of the formed light-emitting functional layer 4 is uniform.

During specific implementation, in the above display substrate provided by the embodiments of the present disclosure, the first pixel defining layer 21 is converted from the hydrophilicity to the hydrophobicity under ultraviolet light irradiation, or the first pixel defining layer 21 is also converted from the hydrophobicity to the hydrophilicity under the ultraviolet light irradiation. The characteristic is described in detail subsequently in combination with specific materials.

During specific implementation, in the above display substrate provided by the embodiments of the present disclosure, the material of the first pixel defining layer 21 is azobenzene, spiropyrane, cinnamic acid, titanium dioxide ($TiO_2$) or vanadium pentoxide (VO5). The five materials in examples are all in a neutral state without treatment of an external condition, and are neither hydrophilic nor hydrophobic. A material of the second pixel defining layer 22 is an insulating material such as SiO, SiN, etc.

Figure 5:
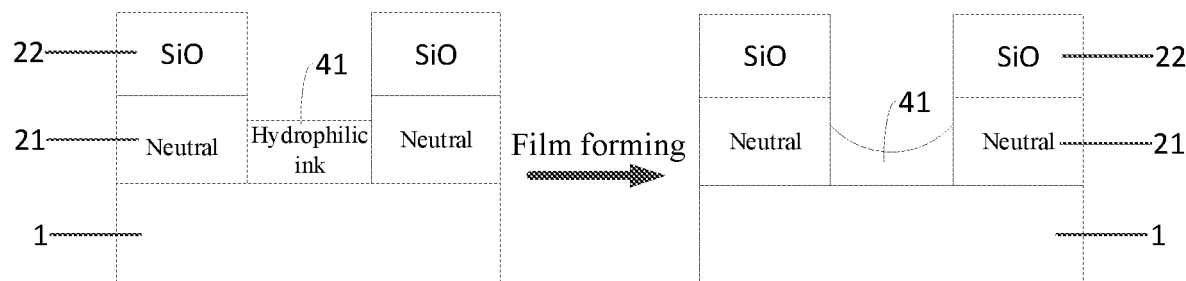
FIG. 5 is a schematic structural diagram for forming a light-emitting functional layer when a display substrate is not treated by an external condition provided by an embodiment of the present disclosure.
Figure 6:
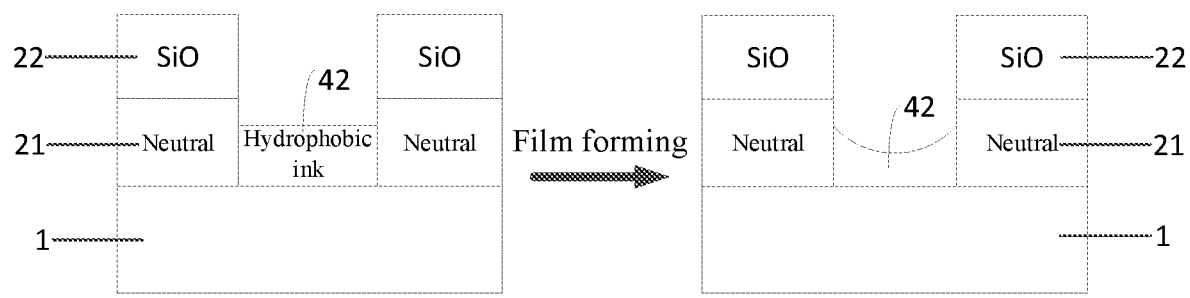
FIG. 6 is another schematic structural diagram for forming a light-emitting functional layer when a display substrate is not treated by an external condition provided by an embodiment of the present disclosure.

Specifically, as shown in FIG. 5, taking an example that the material of the first pixel defining layer 21 is titanium dioxide and the material of the second pixel defining layer 22 is SiO, the titanium dioxide is in a neutral state without treatment of an external condition; and when the hole injection layer 41 is formed by adopting the ink-jet printing process, the hole injection layer 41 is hydrophilic, and the hydrophilic hole injection layer 41 climbs to the inner wall of the first pixel defining layer 21 due to the Marangoni effect, to cause a phenomenon that the formed hole injection layer 41 is thin in middle and thick on two sides, so that the film thickness of the formed hole injection layer 41 is not uniform, and the efficiency and the service life of the display device are affected. Similarly, as shown in FIG. 6, the difference between FIG. 6 and FIG. 5 only lies in that a hydrophobic film layer such as the hole transport layer 42 is formed by adopting the ink-jet printing process. The hole transport layer 42 is hydrophobic, and the hydrophobic hole transport layer 42 also climbs to the inner wall of the first pixel defining layer 21 due to the Marangoni effect, to cause a phenomenon that the formed hole transport layer 42 is thin in middle and thick on two sides, so that the film thickness of the formed hole transport layer 42 is not uniform, and the efficiency and the service life of the display device are affected.

Therefore, in order to solve the problem that the formed film layers are not uniform due to inconsistent hydrophilicity or hydrophobicity of all the film layers of the light-emitting functional layer 4, in the present disclosure, the first pixel defining layer 21 is treated under the external condition to be converted into hydrophilicity or hydrophobicity, correspondingly, the hydrophilicity or hydrophobicity of the film layers of the formed light-emitting functional layer 4 are opposite to the hydrophilicity or hydrophobicity of the first pixel defining layer 21, so that the film layers of the formed light-emitting functional layer 4 may be uniform, the efficiency of the light-emitting device is improved, and the service life of the light-emitting device is prolonged.

Specifically, the external condition mentioned in the embodiments of the present disclosure may be: ultraviolet light irradiation, visible light irradiation (such as blue light), heating, darkroom placement and the like.

Figure 7A:
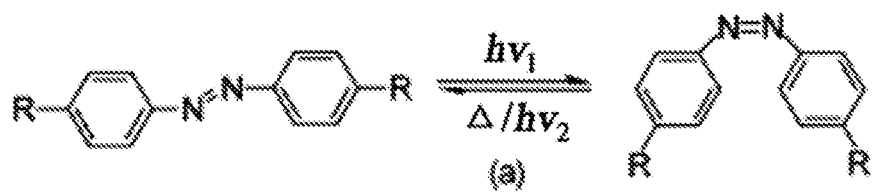
FIG. 7A is a schematic diagram of hydrophobicity conversion of a first pixel defining layer material in a display substrate provided by an embodiment of the present disclosure.

Specifically, as shown in FIG. 7A, a thin film formed by adopting azobenzene presents a cis-structure under irradiation of ultraviolet light $hv_1$ (such as a wavelength of 365 nm), the polarity is increased to reach a surface hydrophilic state, and a contact angle with water can reach 15 degrees. After completing ultraviolet light irradiation, the azobenzene thin film is heated (Δ) or irradiated by visible light $hv_2$ (such as blue light), azobenzene can be changed into a trans-structure, the polarity is reduced, the hydrophobic characteristic is presented, and the contact angle with water reaches 70 degrees.

Specifically, as shown in FIG. 7B, spiropyrane presents hydrophobicity after being irradiated by ultraviolet light $hv_1$, and presents hydrophilicity after chemical bonds are broken after being heated (Δ) or irradiated by visible light $hv_2$.

Specifically, as shown in FIG. 7C, cinnamic acid presents hydrophilicity after being irradiated by ultraviolet light $hv_1$, and is subjected to dimerization after being irradiated by visible light $hv_2$ to present hydrophobicity.

Specifically, titanium dioxide ($TiO_2$) presents hydrophilicity after being irradiated by the ultraviolet light, and presents hydrophobicity after being placed in a dark room for 24 hours.

Specifically, vanadium pentoxide (VO5) presents hydrophilicity after being irradiated by the ultraviolet light, and presents hydrophobicity after being placed in the dark room for 24 hours.

Specifically, as shown in FIG. 8, taking an example that the material of the first pixel defining layer 21 is titanium dioxide ($TiO_2$) and the material of the second pixel defining layer 22 is SiO, titanium dioxide is converted into a surface hydrophilic state under ultraviolet light irradiation (UV irradiation), so that the first pixel defining layer 21 may be irradiated by UV before the hydrophobic hole transport layer 42 and light-emitting layer 43 are formed. As shown in FIG. 9, taking an example that the material of the first pixel defining layer 21 is titanium dioxide (TiO2) and the material of the second pixel defining layer 22 is SiO, a structure of FIG. 9 is placed in a dark place (such as placing for 24 hours), and titanium dioxide is converted into a surface hydrophobic state, so that the structure of FIG. 9 may be placed in the dark place before the hydrophilic hole injection layer 41 and electron transport layer 44 are formed, so that the first pixel defining layer 21 is hydrophobic.

Therefore, the above five materials for manufacturing the first pixel defining layer provided by the embodiments of the present disclosure have reversible change of the hydrophilicity or the hydrophobicity under the external condition. Specifically, how to form each film layer of the light-emitting functional layer with inconsistent hydrophilicity or hydrophobicity by adopting the reversible change characteristic is introduced in detail in a subsequent preparation method.

During specific implementation, in the above display substrate provided by the embodiments of the present disclosure, a thickness of the first pixel defining layer 21 is 100 nm to 200 nm, and a thickness of the second pixel defining layer 22 is 50 nm to 150 nm.

During specific implementation, in the above display substrate provided by the embodiments of the present disclosure, a thickness of the light-emitting functional layer 4 is 100 nm to 200 nm; and during manufacturing, it is only needed to ensure that the thickness of the first pixel defining layer 21 is greater than the thickness of the light-emitting functional layer 4.

Figure 10:
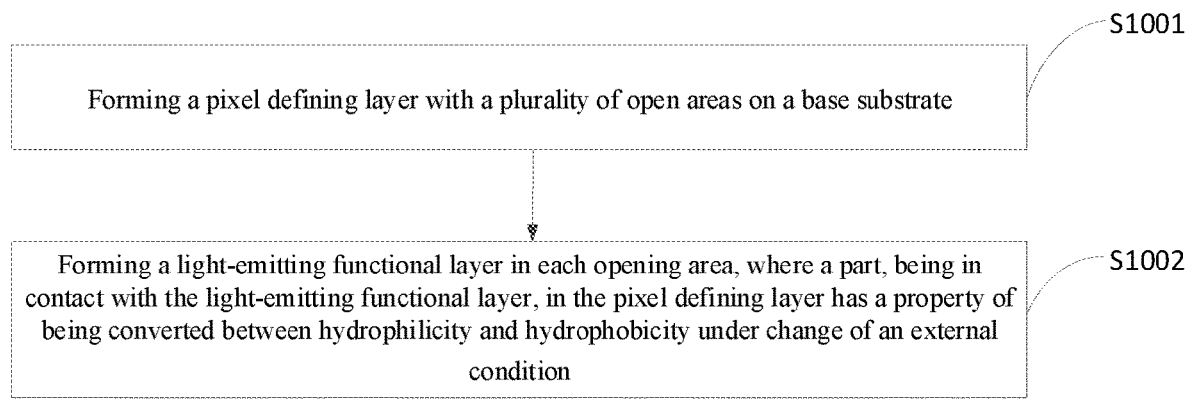
FIG. 10 is a schematic flow diagram of a preparation method of a display substrate provided by an embodiment of the present disclosure.

Based on the same inventive concept, embodiments of the present disclosure further provide a preparation method of a display substrate, as shown in FIG. 10, including the following.

S1001, a pixel defining layer with a plurality of opening areas is formed on a base substrate.

S1002, a light-emitting functional layer is formed in each opening area; where a part, being in contact with the light-emitting functional layer, in the pixel defining layer has a property of being converted between hydrophilicity and hydrophobicity under change of an external condition; and before each film layer in the light-emitting functional layer is formed in each opening area, a hydrophilic or hydrophobic property of the part, being in contact with the light-emitting functional layer to be formed in the pixel defining layer are adjusted to be opposite to a hydrophilic or hydrophobic property of the light-emitting functional layer to be formed.

According to the preparation method of the display substrate provided by the embodiments of the present disclosure, the part, being in contact with the light-emitting functional layer, in the pixel defining layer is set to have the property of being converted between the hydrophilicity and the hydrophobicity under change of the external condition. In this way, when forming each film layer of the light-emitting functional layer, the hydrophilicity or hydrophobicity of each film layer of the light-emitting functional layer are not consistent, for example, when forming the hydrophilic light-emitting functional layer, the part, being in contact with the light-emitting functional layer, of the pixel defining layer is converted to be hydrophobic under treatment of the external condition; and when forming the hydrophobic light-emitting functional layer, the part, being in contact with the light-emitting functional layer, of the pixel defining layer is converted to be hydrophilic under treatment of the external condition. Therefore, the light-emitting functional layer formed in the opening areas does not climb to an inner wall of the pixel defining layer, it is ensured that a film thickness of the light-emitting functional layer formed in the opening areas is uniform, a display effect of a display panel is improved, and a service life of a light-emitting device is prolonged.

Figure 11:
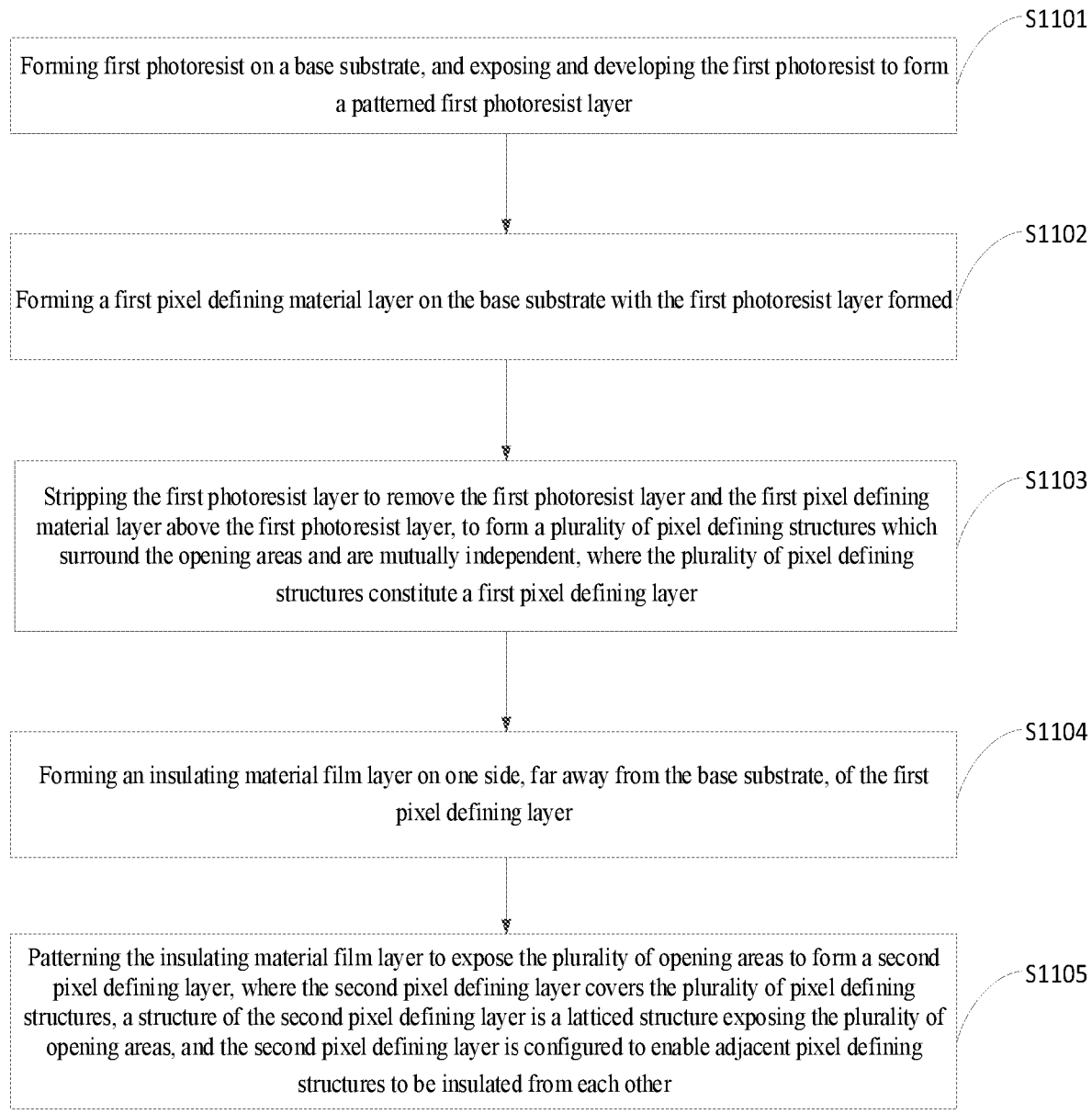
FIG. 11 is another schematic flow diagram of a preparation method of a display substrate provided by an embodiment of the present disclosure.

During specific implementation, in the above preparation method provided by the embodiments of the present disclosure, as shown in FIG. 11, the forming the pixel defining layer with the plurality of opening areas on the base substrate, specifically includes the following.

Figure 13A:
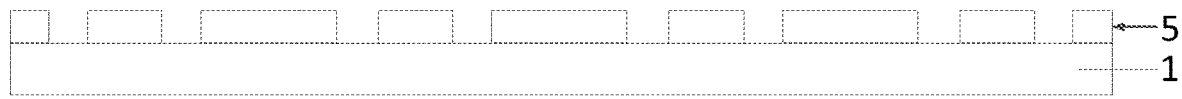
FIG. 13A-FIG. 13I are schematic section diagrams of a preparation method of a display substrate after performing respective steps provided by an embodiment of the present disclosure.

S1101, first photoresist is formed on the base substrate, and the first photoresist is exposed and developed to form a patterned first photoresist layer. Specifically, as shown in FIG. 13A, the first photoresist is formed on the base substrate 1 with an anode formed, and the first photoresist is exposed and developed to form the patterned first photoresist layer 5.

Figure 13B:
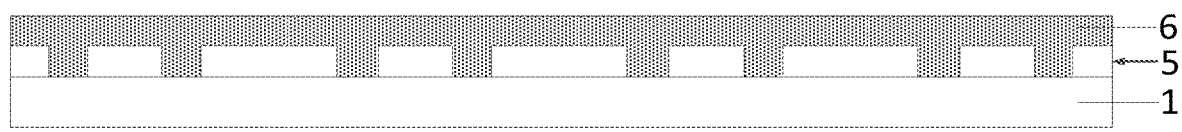

S1102, a first pixel defining material layer is formed on the base substrate with the first photoresist layer formed. Specifically, as shown in FIG. 13B, for example, an azobenzene material layer 6 is formed on the base substrate 1 with the first photoresist layer 5 formed.

Figure 13C:
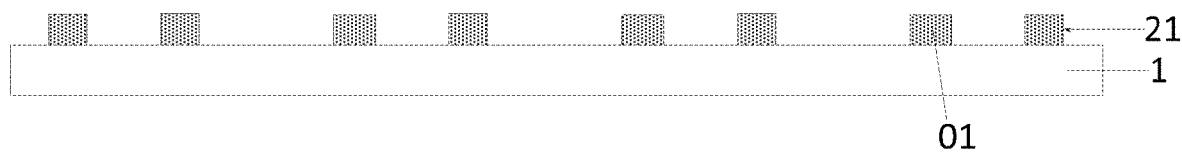

S1103, the first photoresist layer is stripped to remove the first photoresist layer and the first pixel defining material layer above the first photoresist layer, to form a plurality of pixel defining structures which surround the plurality of opening areas and are mutually independent. Specifically, as shown in FIG. 13C, the first photoresist layer 5 is stripped to remove the first photoresist layer 5 and a titanium dioxide material layer 6 above the first photoresist layer 5, so as to form the plurality of pixel defining structures 01 which surround all the opening areas 3 and are mutually independent, and the plurality of pixel defining structures 01 constitute the first pixel defining layer 21.

Figure 13D:
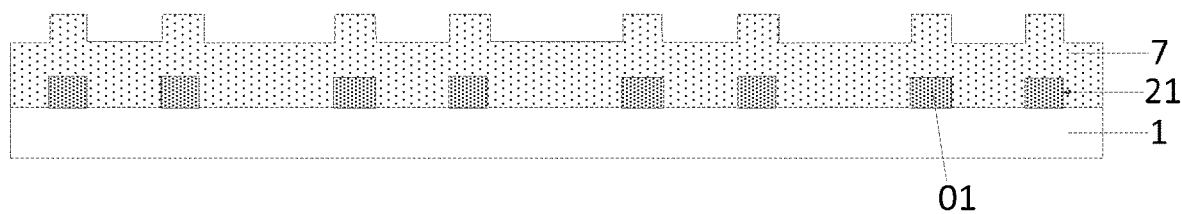

S1104, an insulating material film layer is deposited on one side, far away from the base substrate, of the first pixel defining layer. Specifically, as shown in FIG. 13D, the insulating material film layer 7 is formed on one side, far away from the base substrate 1, of the first pixel defining layer 21 by adopting a plasma enhanced chemical vapor deposition (PECVD) process.

Figure 13E:
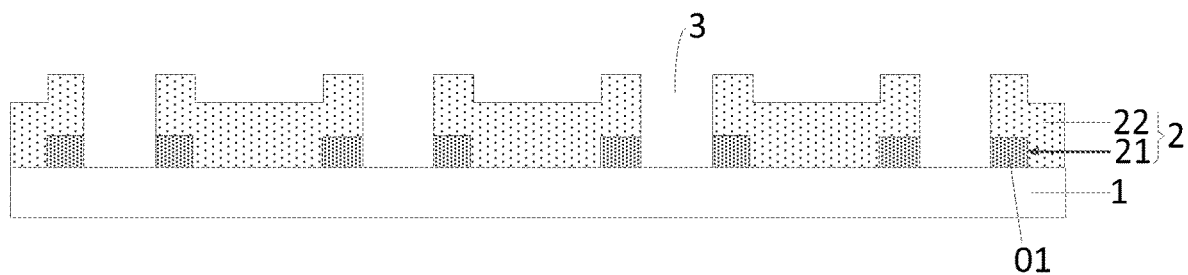

S1105, the insulating material film layer is patterned to expose the plurality of opening areas to form a second pixel defining layer; where the second pixel defining layer covers the plurality of pixel defining structures, a structure of the second pixel defining layer is a latticed structure exposing the plurality of opening areas, and the second pixel defining layer is configured to enable adjacent pixel defining structures to be insulated from each other. Specifically, as shown in FIG. 13E, the insulating material film layer 7 is patterned to expose all the opening areas 3 so as to form the second pixel defining layer 22 which covers the plurality of pixel defining structures 01 and is the latticed structure.

Figure 12:
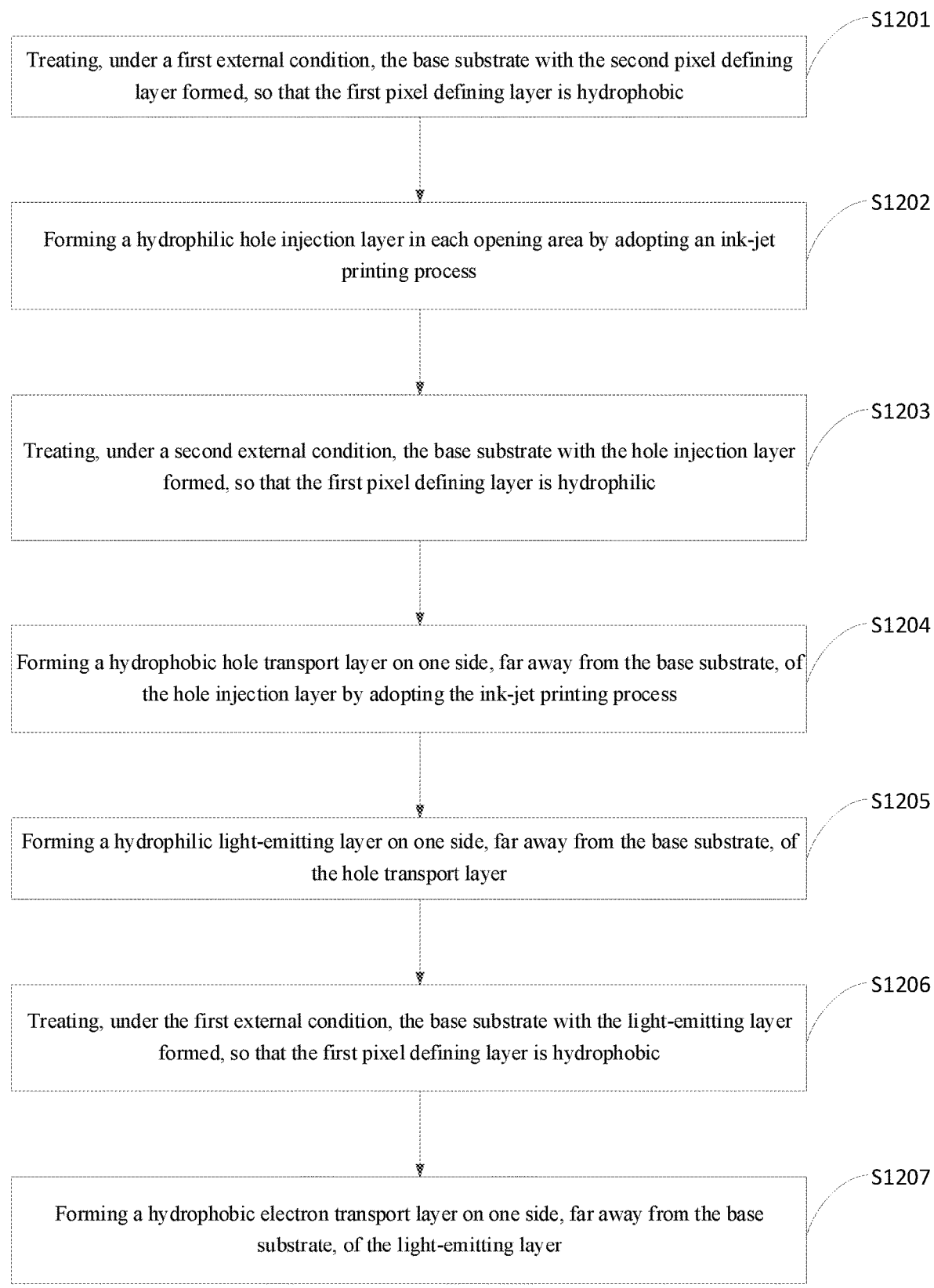
FIG. 12 is another schematic flow diagram of a preparation method of a display substrate provided by an embodiment of the present disclosure.

During specific implementation, in the above preparation method provided by the embodiments of the present disclosure, as shown in FIG. 12, the forming the light-emitting functional layer in each opening area, specifically includes the following.

S1201, the base substrate with the second pixel defining layer formed is treated under a first external condition, so that the first pixel defining layer is hydrophobic. Specifically, a thin film formed by azobenzene is hydrophilic under irradiation of ultraviolet light (such as a wavelength of 365 nm) and is hydrophobic under heating or irradiation of visible light (for example, blue light), therefore, the base substrate 1 with the second pixel defining layer 22 formed is treated under the first external condition, that is, the base substrate 1 with the second pixel defining layer 22 formed is heated or irradiated by visible light (such as blue light) for 1-30 min. so that the first pixel defining layer 21 is hydrophobic.

Figure 13F:
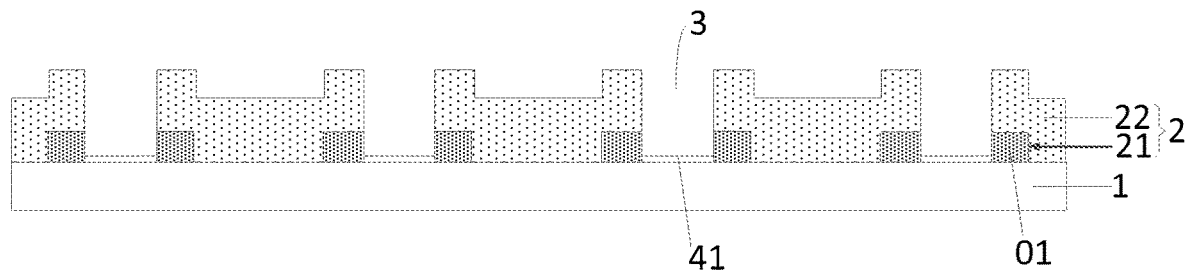

S1202, a hydrophilic hole injection layer is formed in each opening area by adopting an ink-jet printing process. Specifically, as shown in FIG. 13F, the hydrophilic hole injection layer 41 is formed in each opening area 3 by adopting the ink-jet printing process.

S1203, the base substrate with the hole injection layer formed is treated under a second external condition, so that the first pixel defining layer is hydrophilic. Specifically, the base substrate 1 with the hole injection layer 41 formed is treated under the second external condition, that is, the base substrate 1 with the hole injection layer 41 formed is irradiated under irradiation of ultraviolet light (such as a wavelength of 365 nm) for 1-30 min for hydrophilic irradiation, so that the first pixel defining layer is hydrophilic.

Figure 13G:
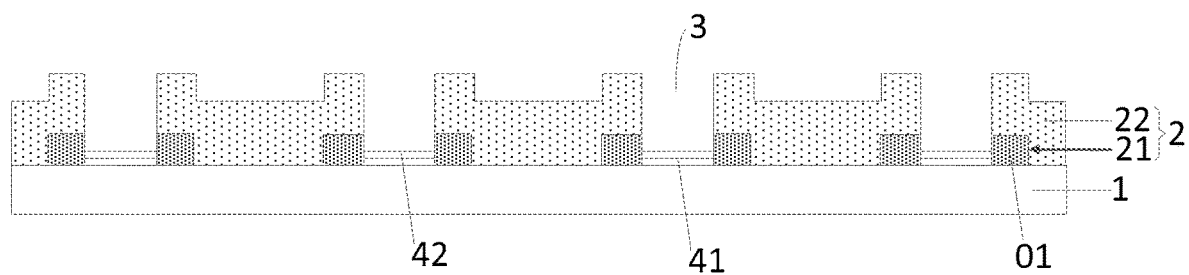

S1204, a hydrophobic hole transport layer is formed on one side, far away from the base substrate, of the hole injection layer by adopting the ink-jet printing process. Specifically, as shown in FIG. 13G, the hydrophobic hole transport layer 42 is formed on one side, far away from the base substrate, of the hole injection layer 41 by adopting the ink-jet printing process.

Figure 13H:
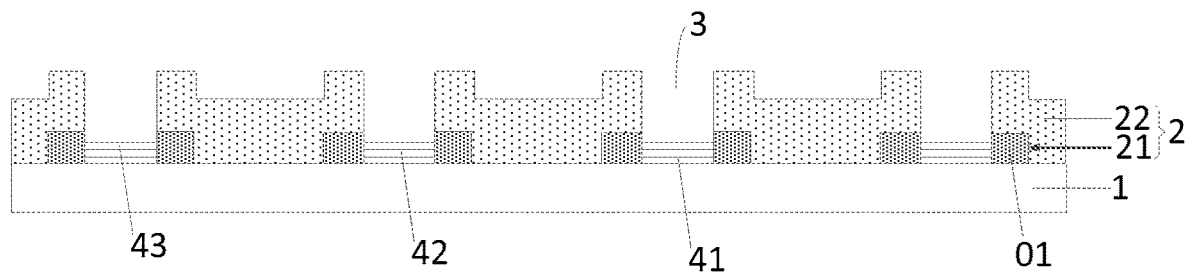

S1205, a hydrophobic light-emitting layer is formed on one side, far away from the base substrate, of the hole transport layer by adopting the ink-jet printing process. Specifically, as shown in FIG. 13H, the hydrophobic light-emitting layer 43 is formed on one side, far away from the base substrate 1, of the hole transport layer 42 by adopting the ink-jet printing process.

S1206, the base substrate with the light-emitting layer formed is treated under the first external condition, so that the first pixel defining layer is hydrophobic. Specifically, base substrate 1 with the light-emitting layer 43 formed is treated under the first external condition, that is, the base substrate 1 with the light-emitting layer 43 formed is heated or irradiated by visible light (such as blue light of 436 nm) for 1-30 min. so that the first pixel defining layer 21 is hydrophobic.

Figure 13I:
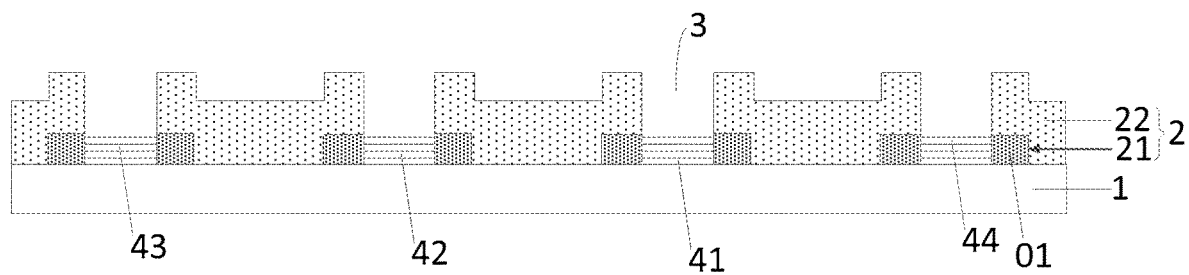

S1207, a hydrophilic electron transport layer is formed on one side, far away from the base substrate, of the light-emitting layer by adopting the ink-jet printing process. Specifically, as shown in FIG. 13I, the hydrophilic electron transport layer 44 is formed on one side, far away from the base substrate 1, of the light-emitting layer 43 by adopting the ink-jet printing process, namely: the display substrate shown in FIG. 2A of the present disclosure is formed.

During specific implementation, after the display substrate shown in FIG. 2A is annealed, aluminum and other metal materials are deposited to serve as the cathode, to complete preparation of an OLED device.

With deep development of a quantum dot technology, the research of an electroluminescent quantum dot light-emitting diode is increasingly deep, the quantum efficiency is continuously improved, and thus the material of the light-emitting layer of the present disclosure may be a quantum dot material, that is, a quantum dot light emitting diode (QLED) device is formed.

During specific implementation, a high-resolution QLED device can be prepared by forming the light-emitting functional layer by adopting an ink-jet printing technology, and therefore, the embodiments of the present disclosure are all illustrated by taking an example of adopting the ink-jet printing technology to form the light-emitting functional layer. Certainly, the technical solution of the present disclosure is suitable for forming the light-emitting functional layer by adopting an evaporation process, which is not limited by the present disclosure.

It should be noted that in the above preparation method of the display substrate provided by the embodiments of the present disclosure, in FIG. 13C, the first photoresist is exposed in a positive photoresist mode. During specific implementation, the first photoresist may also be exposed in a reverse photoresist mode. The specific exposure mode is selected according to the actual application situation, which is not specifically limited here.

It should be noted that in the above preparation method of the display substrate provided by the embodiments of the present disclosure, a patterning process may only include a photoetching process, or may include the photoetching process and an etching step, and meanwhile, may also include printing, ink jetting and other processes for forming preset patterns. The photoetching process refers to a process including the technical processes of film forming, exposure, development and the like for forming a pattern by using photoresist, a mask, an exposure machine and the like. During specific implementation, a corresponding patterning process may be selected according to the structure formed in the present disclosure.

Based on the same inventive concept, embodiments of the present disclosure further provide a display apparatus, including the display substrate in the above embodiments. Principles of the display apparatus for solving the problems are similar to that of the above display substrate, therefore, implementation of the display apparatus may refer to that of the above display substrate, and repetitions are omitted.

Figure 14:
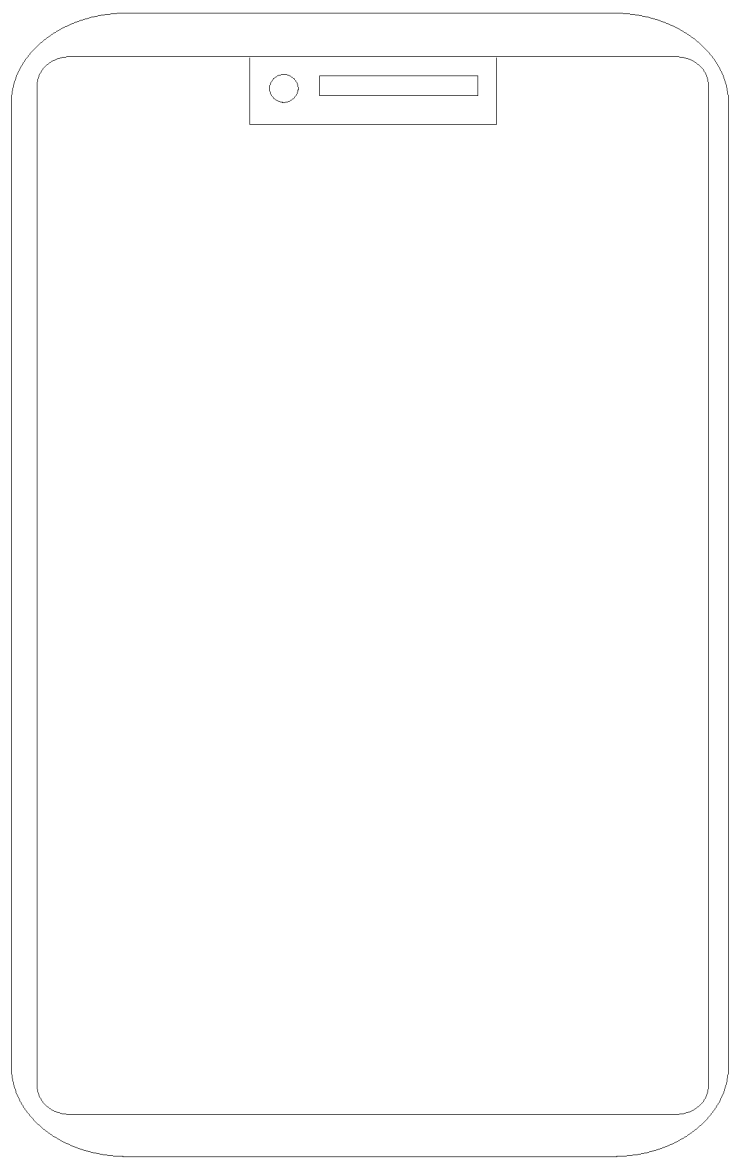
FIG. 14 is a schematic structural diagram of a display apparatus provided by an embodiment of the present disclosure.

During specific implementation, the display apparatus provided by the embodiments of the present disclosure, as shown in FIG. 14, may be any product or component with a display function, such as a mobile phone, a tablet computer, a television, a display, a notebook computer, a digital photo frame, a navigator, etc.

According to the above display substrate, the preparation method thereof and the display apparatus provided by the embodiments of the present disclosure, the part, being in contact with the light-emitting functional layer, in the pixel defining layer is set to have the property of being converted between the hydrophilicity and the hydrophobicity under change of the external condition. In this way, when forming each film layer of the light-emitting functional layer, the hydrophilicity or hydrophobicity of film layers of the light-emitting functional layer are not consistent: for example, when the hydrophilic light-emitting functional layer is formed, the part, being in contact with the light-emitting functional layer, of the pixel defining layer is converted to be hydrophobic under treatment of the external condition; and when the hydrophobic light-emitting functional layer is formed, the part, being in contact with the light-emitting functional layer, of the pixel defining layer is converted to be hydrophilic under treatment of the external condition. Therefore, the light-emitting functional layer formed in the opening areas does not climb to the inner wall of the pixel defining layer, it is ensured that the film thickness of the light-emitting functional layer formed in the opening areas is uniform, the display effect of the display panel is improved, and the service life of the light-emitting device is prolonged.

Obviously, those skilled in the art can make various modifications and variations to the present disclosure without departing from the spirit and scope of the present disclosure. In this way, if these modifications and variations of the present disclosure belong within the scope of the claims of the present disclosure and their equivalent techniques, the present disclosure is also intended to include these modifications and variations.

What is claimed is:

1. A display substrate, comprising:
   a base substrate;
   a pixel defining layer, arranged on one side of the base substrate, wherein the pixel defining layer has a plurality of opening areas; and
   a light-emitting functional layer, arranged in the plurality of opening areas;
   wherein a part, being in contact with the light-emitting functional layer, in the pixel defining layer has a property of being converted between hydrophilicity and hydrophobicity under change of an external condition;
   wherein the pixel defining layer comprises:
   a first pixel defining layer; wherein the first pixel defining layer comprises a plurality of pixel defining structures which surround the plurality of opening areas and are mutually independent; wherein the plurality of pixel defining structures are in contact with the light-emitting functional layer; and
   a second pixel defining layer; wherein the second pixel defining layer is arranged on one side, far away from the base substrate, of the first pixel defining layer; and the second pixel defining layer covers the plurality of pixel defining structures; wherein a structure of the second pixel defining layer is a latticed structure exposing the plurality of opening areas; wherein the second pixel defining layer is configured to enable adjacent pixel defining structures to be insulated from each other;
   wherein a material of the first pixel defining layer is azobenzene, spiropyrane, cinnamic acid, titanium dioxide or vanadium pentoxide; and a material of the second pixel defining layer is an insulating material.

2. The display substrate according to claim 1, wherein a thickness of each of the plurality of pixel defining structures is greater than a thickness of the light-emitting functional layer along a direction pointing from the base substrate to the pixel defining layer.

3. The display substrate according to claim 1, wherein the first pixel defining layer is converted from hydrophilicity to hydrophobicity, or converted from hydrophobicity to hydrophilicity under ultraviolet light irradiation.

4. The display substrate according to claim 1, wherein a thickness of the first pixel defining layer is 100 nm to 200 nm, and a thickness of the second pixel defining layer is 50 nm to 150 nm.

5. The display substrate according to claim 1, wherein the light-emitting functional layer comprises a hole injection layer, a hole transport layer, a light-emitting layer and an electron transport layer arranged in a stacked manner.

6. The display substrate according to claim 5, wherein the hole injection layer and the electron transport layer are hydrophilic, and the hole transport layer and the light-emitting layer are hydrophobic.

7. The display substrate according to claim 5, wherein a material of the light-emitting layer is a quantum dot material.

8. A display apparatus, comprising the display substrate according to claim 1.

9. A preparation method of a display substrate, comprising:
   forming a pixel defining layer with a plurality of opening areas on a base substrate;
   forming a light-emitting functional layer in each of the plurality of opening areas;
   wherein a part, being in contact with the light-emitting functional layer, in the pixel defining layer has a property of being converted between hydrophilicity and hydrophobicity under change of an external condition; and
   before forming each film layer in the light-emitting functional layer in the each of the plurality of opening areas, adjusting a hydrophilic or hydrophobic property of the part, being in contact with a light-emitting functional layer to be formed, in the pixel defining layer to be opposite to a hydrophilic or hydrophobic property of the light-emitting functional layer to be formed;
   wherein the pixel defining layer comprises:
   a first pixel defining layer; wherein the first pixel defining layer comprises a plurality of pixel defining structures which surround the plurality of opening areas and are mutually independent; wherein the plurality of pixel defining structures are in contact with the light-emitting functional layer; and
   a second pixel defining layer; wherein the second pixel defining layer is arranged on one side, far away from the base substrate, of the first pixel defining layer; and the second pixel defining layer covers the plurality of pixel defining structures; wherein a structure of the second pixel defining layer is a latticed structure exposing the plurality of opening areas;
   wherein the second pixel defining layer is configured to enable adjacent pixel defining structures to be insulated from each other;
   wherein a material of the first pixel defining layer is azobenzene, spiropyrane, cinnamic acid, titanium dioxide or vanadium pentoxide; and a material of the second pixel defining layer is an insulating material.

10. The preparation method according to claim 9, wherein the forming the pixel defining layer with the plurality of opening areas on the base substrate, specifically comprises:
   forming first photoresist on the base substrate, and exposing and developing the first photoresist to form a patterned first photoresist layer;
   forming a first pixel defining material layer on the base substrate with the first photoresist layer formed;
   stripping the first photoresist layer to remove the first photoresist layer and the first pixel defining material layer above the first photoresist layer, to form the plurality of pixel defining structures which surround the plurality of opening areas and are mutually independent, wherein the plurality of pixel defining structures constitute the first pixel defining layer;
   forming an insulating material film layer on one side, far away from the base substrate, of the first pixel defining layer; and
   patterning the insulating material film layer to expose the plurality of opening areas to form the second pixel defining layer; wherein the second pixel defining layer covers the plurality of pixel defining structures, a structure of the second pixel defining layer is a latticed structure exposing the plurality of opening areas, and the second pixel defining layer is configured to enable adjacent pixel defining structures to be insulated from each other.

11. The preparation method according to claim 10, wherein the forming the light-emitting functional layer in each of the plurality of opening areas, specifically comprises:
   treating, under a first external condition, the base substrate with the second pixel defining layer formed, so that the first pixel defining layer is hydrophobic;
   forming a hydrophilic hole injection layer in each opening area by adopting an ink-jet printing process;
   treating, under a second external condition, the base substrate with the hole injection layer formed, so that the first pixel defining layer is hydrophilic;
   forming a hydrophobic hole transport layer on one side, far away from the base substrate, of the hole injection layer by adopting the ink-jet printing process;
   forming a hydrophobic light-emitting layer on one side, far away from the base substrate, of the hole transport layer by adopting the ink-jet printing process;
   treating, under the first external condition, the base substrate with the light-emitting layer formed, so that the first pixel defining layer is hydrophobic; and
   forming a hydrophilic electron transport layer on one side, far away from the base substrate, of the light-emitting layer by adopting the ink-jet printing process.

* * * * *